Nov. 23, 1954 R. S. BURWEN 2,695,337

POWER AUDIO AMPLIFIER

Filed Feb. 20, 1950 4 Sheets-Sheet 1

INVENTOR.
RICHARD S. BURWEN
BY Ezekiel Wolf
his Attorney

Nov. 23, 1954 R. S. BURWEN 2,695,337

POWER AUDIO AMPLIFIER

Filed Feb. 20, 1950 4 Sheets-Sheet 2

INVENTOR.
RICHARD S. BURWEN

BY Ezekiel Wolf
his Attorney

INVENTOR.
RICHARD S. BURWEN
BY Ezekiel Wolf
his Attorney

Nov. 23, 1954 R. S. BURWEN 2,695,337

POWER AUDIO AMPLIFIER

Filed Feb. 20, 1950

4 Sheets-Sheet 4

INVENTOR.
RICHARD S. BURWEN

BY Ezekiel Wolf
his Attorney

United States Patent Office 2,695,337

Patented Nov. 23, 1954

2,695,337

POWER AUDIO AMPLIFIER

Richard S. Burwen, Melrose, Mass.

Application February 20, 1950, Serial No. 145,244

1 Claim. (Cl. 179—171)

The present invention relates to a vacuum tube power audio amplifier intended for producing voice, music, signals or any other sounds or noises extending from the sub-audible to the supersonic range without distortion, with true fidelity regardless of the type or character of the signal.

It is well known that many amplifiers cannot be operated at low distortion over a broad frequency range and that when feedback is used to improve performance, distortion, particularly on transient signals, is frequently increased due to peaks in amplification at high and low frequencies and a tendency for the amplifier to oscillate.

Most feedback amplifiers of the present general type have resonant peaks at either their low or high ends or at both ends of the frequency range which are primarily due to phase shifting converting negative feedback to positive feedback. In the present invention this is overcome by means of special high and low frequency feedback loops which always maintain a negative feedback character even though the phase shifting in the amplifier is more than 90°. Also methods of emphasizing or deemphasizing certain frequency ranges in order to change the tonal balance of sound reproducing systems have not heretofore taken full advantage of the capabilities of feedback not have they used the available amplification with maximum efficiency.

This audio amplifier consists basically of a new feedback, tone control amplifier stage and a multi-stage amplifier employing a new system of multiple feedback loops intended to supply power to a low impedance load such as a loudspeaker, all powered by a conventional power supply.

In principle the tone control stage operates with a feedback from plate to grid through an impedance causing a voltage drop across a grid impedance and thereby reducing the gain of the amplifier. With a large amount of feedback the gain of the stage is approximately equal to the ratio of the feeback impedance to the grid impedance. The frequency response of the amplifier stage can thus be controlled by making the ratio, designated here as $Z_2/Z_1$, a desired function of frequency. Various arrangements and modifications of this method of feedback may be used as for instance, a single element, a network of a more complicated nature, a bridge network and systems in which manual variation may be effected at will. In the reproduction of vocal and instrumental music, means may be used in this way to emphasize and decrease the treble and the bass register so that a complete tone control may be obtained.

A further object of the present invention is the control by means of feedback loops of amplification whereby a high degree of stability over the whole range of frequencies is obtained. Various loops feed back from the output circuit to earlier stages directly or through high and low pass filters or filter elements to effect in combination the desired results.

The invention will be more fully described in the specification below when taken in connection with the drawings illustrating the same in which Figure 1 shows a schematic wiring diagram of the amplifier as a whole.

Figure 1:
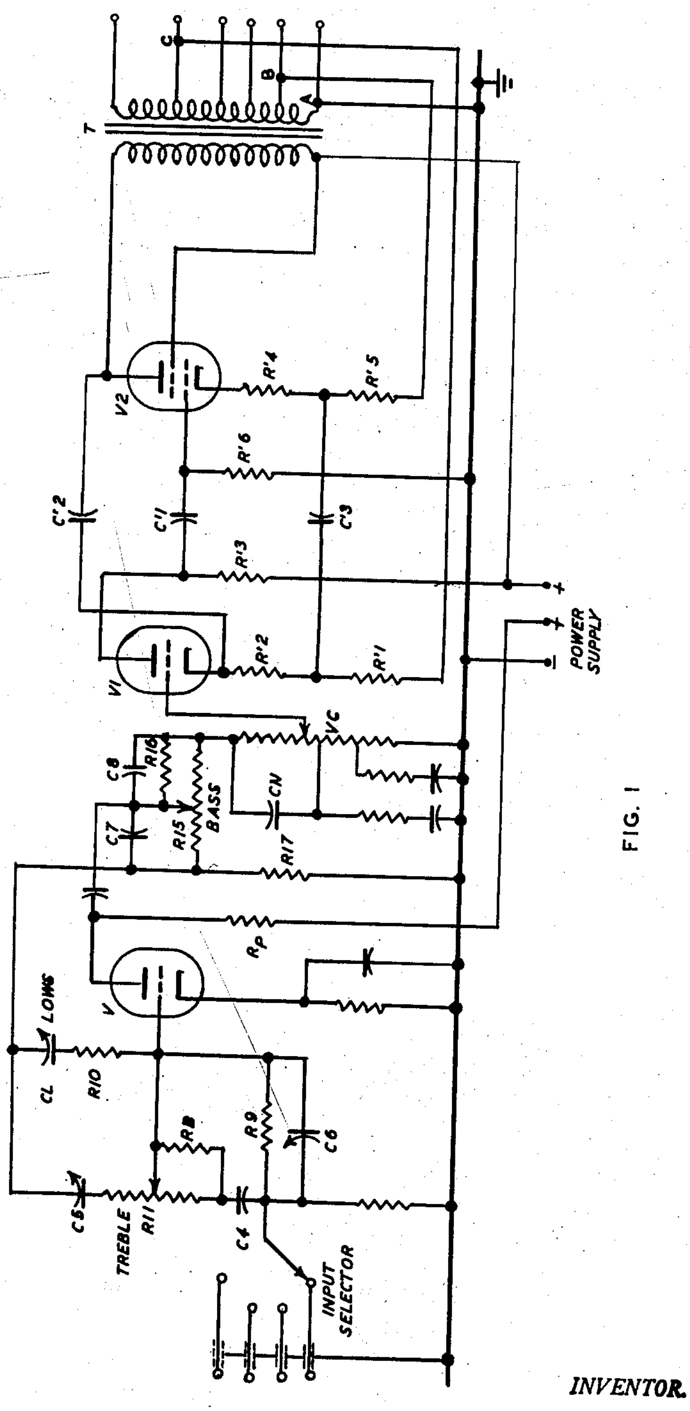

In the arrangement shown in Figure 1, there are three amplifier stages, the first stage with a vacuum tube V having the feedback tone control and the other stages with the tubes $V_1$ and $V_2$ having positive and negative feedback loops. For the purposes of understanding this circuit more clearly, some of the detail figures analyzing the tone control feedback from plate to grid of the first tube and the feedback loops around the output and the power amplifier stages will be first considered.

Figure 2:
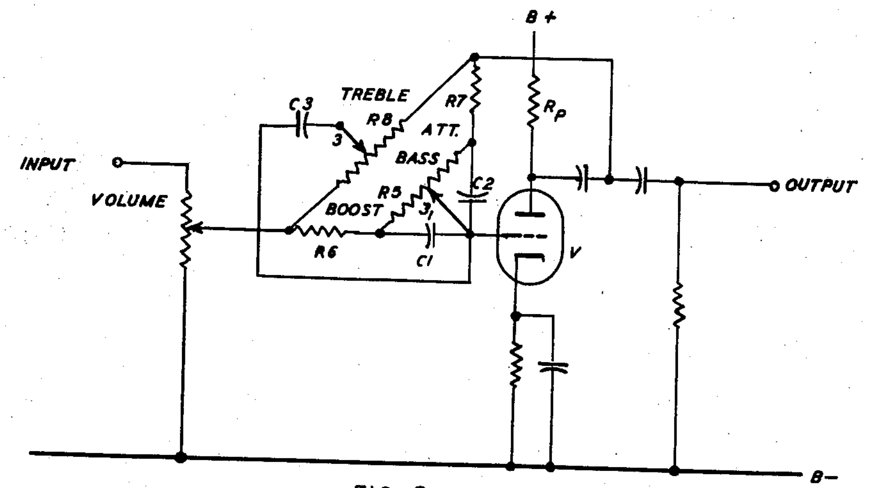
Figure 2 shows a modification of the tone control stage.
Figure 3:
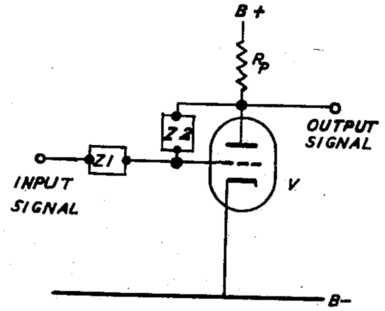
Figures 3 and 4 show block diagrams of the feedback arrangement for the tone control.

The tone control stage in a modified form is shown in Figure 2. The principles under which this part of the circuit operates are indicated in Figure 3 in which V is the vacuum tube, $R_p$ a resistance or impedance in the plate circuit, and $Z_2$ a feedback impedance from the plate to the grid circuit, while $Z_1$ shows an impedance in the grid circuit. Under general conditions where the amount of feedback is large, the gain in the amplifier stage is equal to the ratio of $Z_2/Z_1$. The feedback from the plate to the grid through the impedance $Z_2$ causes a voltage drop across $Z_1$. The frequency response of the amplifier stage can thus be controlled by making the ratio $Z_2/Z_1$ a desired function of the frequency. For example, making $Z_2$ larger at higher frequencies than at lower frequencies and at the same time maintaining $Z_1$ constant with frequency will result in increasing gain in amplification at higher frequencies.

Figure 4:
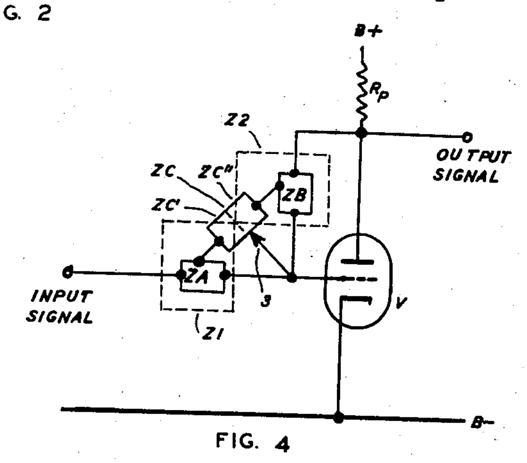

In a tone control system it is frequently desirable to have one setting of the tone controls, say the mid-position, to produce a flat gain characteristic and to have settings on either side of this produce respectively boost or attenuation in certain ranges of frequencies. A method I have devised for accomplishing this is to include in $Z_1$ a portion of a tapped element, the other part of which is contained in $Z_2$. The arrangement is shown in Figure 4. $Z_1$ consists of the three terminal network $Z_a$ plus $Z_c'$ which is the lower part of $Z_c$, an element with a variable tap 3 such as a potentiometer, inductance, or a split stator variable capacitor. $Z_2$ consists of the three terminal network $Z_b$ plus $Z_c''$ which is the remaining portion of $Z_c$ not included in $Z_1$. The effect of moving the tap in one direction is to transfer some of $Z_c$ out of $Z_1$ and into $Z_2$ and in the other direction is to transfer some of $Z_c$ out of $Z_2$ and into $Z_1$. If $Z_1$ is a network of the same form as $Z_2$, containing the same types of elements in corresponding branches, and the elements in $Z_2$ are all the same multiple of the elements in $Z_1$ the magnitude of $Z_2$ as a function of frequency is a multiple of $Z_1$. With a large amount of feedback the gain of the amplifier will thus be a constant $Z_2/Z_1$. Flat response will thus be maintained even though neither $Z_1$ nor $Z_2$ itself is a constant impedance. This condition can be made to hold when the tap on $Z_c$ is at say the mid-position. Then positions on either side of this will upset the balance of the circuit and produce the desired variations in gain with frequency.

In the flat response setting it will usually happen that this circuit forms a sort of a balanced bridge in which no current flows between the tap 3 on $Z_c$ and the grid junction point. Consequently another impedance can be inserted in this arm which will affect the response only in the unbalanced positions of the tap.

Figure 5:
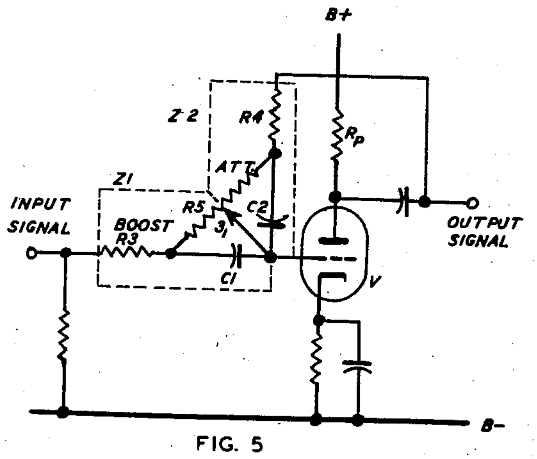
Figures 5, 6, 7 and 8 show further variations of feedback arrangements for tone control.

A modification of this circuit used for boosting or attenuating low frequencies, leaving the middle and high frequencies unaffected is shown in Figure 5. The elements essential to the new circuit are labeled. Moving the potentiometer arm 3 to the "Boost" position tends to short out $C_1$, a condenser forming a part of $Z_1$, making $Z_1$ a pure resistance while $Z_2$ becomes a network whose impedance rises at low frequencies due to the reactance of $C_2$ with a maximum limit set by $R_5$. Bass is attenuated by shorting out $C_2$ and making $Z_2$ a pure resistance while $Z_1$ rises at low frequencies due to the reactance of $C_1$. The presence of $R_5$ limits the maximum available boost or attenuation when one capacitor is shorted out. At the flat response setting $Z_2$ can be made proportional to $Z_1$ by proper selection of values.

A modification of this circuit is to connect a resistance between the arm and one end of the potentiometer. There will be a new position at which $Z_2/Z_1$ is constant with frequency and flat response attained. However, the maximum resistance attainable between the arm and the end to which the resistance is connected will be less than the maximum resistance attainable between the arm and the other end. This arrangement permits the maximum attenuation to be more limited than the maximum boost or the reverse as desired.

Figure 6:
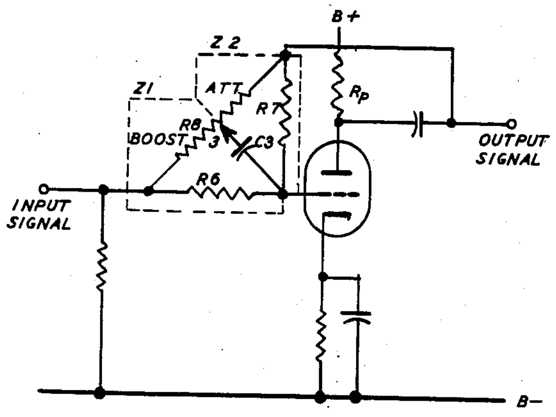

A bridge arrangement for boosting or attenuating high frequencies with respect to a flat response position is shown in Figure 6. In the balanced condition no current flows through $C_3$ connected in the tap 3 and flat response is attained since the feedback is constant with frequencies. When the arm 3 is at the "Boost" end of the potentiometer, $C_3$ is shunted across $R_6$, reducing $Z_1$ at high frequencies, causing less feedback and as a result more gain at high frequencies. When the arm 3 is at the "Attenuation" end of the potentiometer, $C_3$ is shunted across $R_7$, increasing the feedback at high frequencies and thus attenuating the high frequencies.

A combination of the bass and treble circuits is shown in Figure 2. The elements are lettered as in Figures 5 for the bass and 6 for the treble separately.

Figure 7:
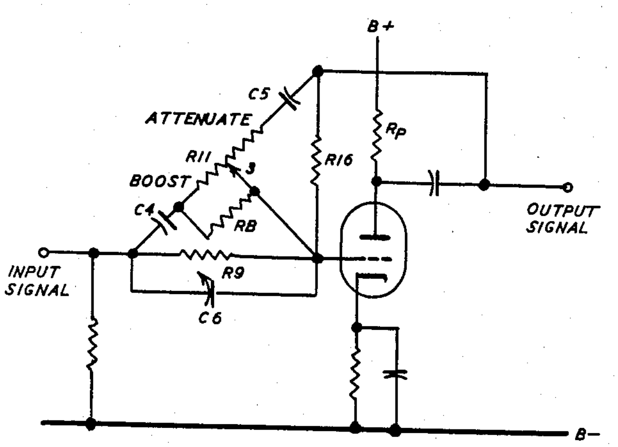

In order to achieve a gain of several times at the flat response setting of the tone controls it is necessary for $Z_2$ to be several times $Z_1$. This complicates matters in that a capacitor which is shunted across a portion of $Z_1$ or of $Z_2$ according to the setting of the tone control will have a greater effect on the larger impedance and the attenuation will begin to take place at lower frequencies than the boost. A method of getting around this difficulty in the treble control is to place capacitors $C_4$ and $C_5$ in series with each end of the treble potentiometer as shown in Figure 7 instead of between the arm and grid. The capacitor at the attenuation end can be made smaller than the one at the boost end and the bridge can again be balanced for flat response. The attenuation will begin to take place at nearly the same frequency as the boost begins.

In my experiments I have found it desirable to have more than 3 db high frequency attenuation occur only at frequencies above 1500 cycles while it is desirable to have a considerable amount of boost available at this frequency; that is, the treble boost should begin lower down in the range at say 500 cycles. The method of accomplishing this is to connect a resistance $R_B$ between the arm and the "Boost" end of the treble potentiometer to limit the maximum resistance between the arm and that end when moved to the "Attenuate" position. Then the decrease in impedance of $Z_2$ with increasing frequency is offset for a time by a decrease in $Z_1$ until a limiting value for $Z_1$ is reached at which point high frequency attenuation begins.

I found that grid to plate capacity of the tube and associated wiring caused the extreme high frequencies to be attenuated by effectively shunting $Z_2$ at high frequencies. This effect may be offset by connecting a capacitor $C_6$ into $Z_1$ so as to reduce $Z_1$ at those same frequencies by a proportionate amount. By making this capacitor adjustable fairly exact compensation can be attained and the capacitor can also be used to provide a fixed amount of extreme high frequency boost if desired by increasing its capacity so as to unbalance the bridge at extreme high frequencies.

By increasing $C_4$ the bridge can be unbalanced at middle frequencies and a boost in the range from say 500 to 1000 cycles can be attained. By decreasing $C_4$ a gradual attenuation between 500 to 1000 cycles can be attained. Also similar effects can be attained by respectively decreasing or increasing $C_5$. By making one of these capacitors a variable I have made a middle frequency tone control.

Figure 8:
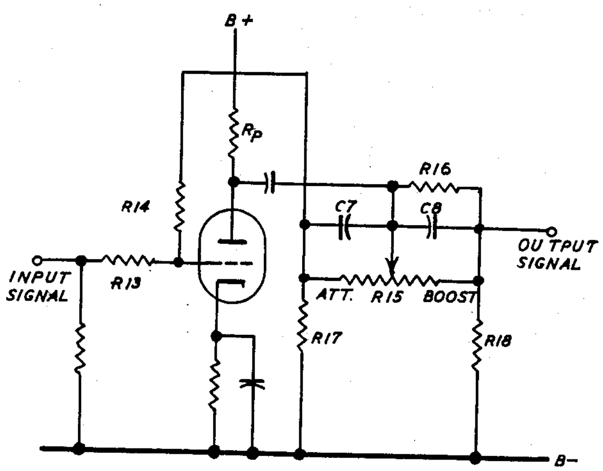

A somewhat more satisfactory bass control which in order to make $Z_2$ several times larger than $Z_1$ does not have to be of such high resistance as the previous one in Figure 5 is shown in Figure 8. Low frequency attenuation in the outgoing signal path caused by $C_8$ together with $R_{18}$ is offset by low frequency attenuation in the feedback pack caused by $C_7$ together with $R_{17}$ and $R_{14}$ which increases the gain of the amplifier at low frequencies. With proper values the net result is flat response.

When the potentiometer arm is moved to the "Boost" position $C_8$ is shorted out, removing the attenuation and at the same time causing greater boost in the amplifier by decreasing the feedback at low frequencies. When the arm is moved to the "Attenuate" position the full amount of feedback occurs at low frequencies and bass is lost through $C_8$. $R_{16}$ limits the maximum bass attenuation.

All the above features are basically incorporated in Figure 1. An additional feature of Figure 1 is the inclusion of an adjustable capacitor $C_L$ (80 to 480 mmf.) marked "Lows" for the extreme low frequencies. This capacitor unbalances the bridge at these frequencies and produces a fixed low frequency boost. By making the capacitor large enough the unbalance is negligible and the response is flat. This capacitor makes it possible to attain more gain and faster rise at the low frequencies than with the single R-C networks described above. A further feature is the double tapped volume control $V_C$ for boosting bass and treble as the volume control is turned down. The loading effect of this control on the preceding circuits is less at low frequencies than at middle and high frequencies and this helps maintain the extreme frequency response of the amplifier. The capacitor $C_N$ from the top terminal to the first tap on the potentiometer is used for the purpose of boosting high frequencies. The grid return resistor $R_9$ is located at the input of the circuit in order not to form a voltage divider and lose some of the signal as would happen if it were connected directly to the grid.

Figure 9:
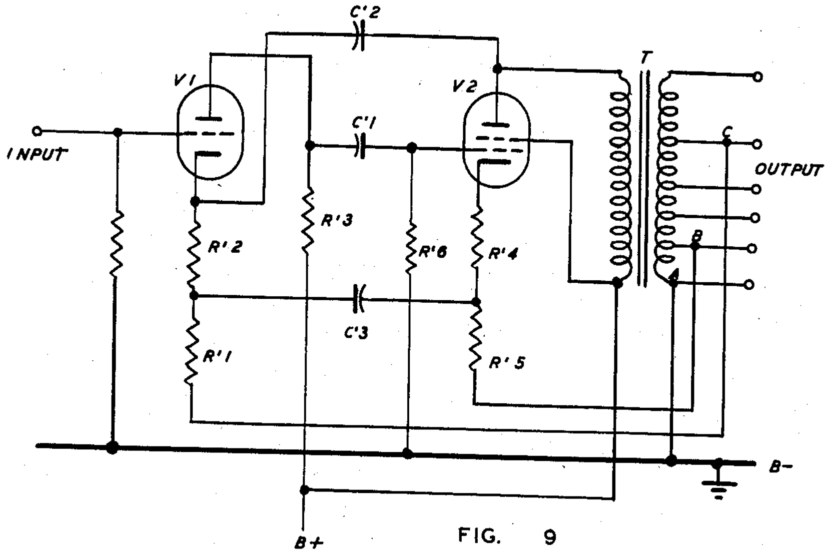
Figure 9 shows a detail of feedback loop between amplifier stages.

The two stage multiple feedback loop amplifier which forms a part of Figure 1 is shown in detail in the circuit of Figure 9. The essential elements of the loop circuit in Figure 9 are labeled.

A combination of positive current feedback and negative voltage feedback is used in this amplifier to control the output impedance. It has been shown that both positive current feedback and negative voltage feedback tend to lower the effective output impedance of an amplifier. Since a signal fed into the cathode of $V_1$ would be amplified and appear at its plate and at the cathode of $V_2$ in substantially the same phase, a signal fed from the cathode of $V_2$ to the cathode of $V_1$ produces a regenerative action or positive feedback. The feedback voltage is developed across $R'_5$ by the plate current of $V_2$ (not necessarily a triode). Since this same current flows through the output transformer, $R'_5$ is in series with the transformer and hence effectively in series with the load by virtue of the transforming action. Thus the voltage developed across $R'_5$ is proportional to the current in the load. This voltage developed across $R'_5$ is coupled through $C'_3$ and $R'_2$ and impressed effectively between the cathode of $V_1$ and ground producing regenerative action or positive current feedback.

Negative voltage feedback is obtained by taking a voltage from one of the low impedance windings on the output transformer and feeding this through $R'_5$, $C'_3$ and $R'_2$ and developing between the cathode of $V_1$ and ground a voltage which is proportional to the voltage at the load. Proper connection of the output transformer will produce a signal which will reduce the overall gain of the amplifier, thus more than offsetting the effect of the positive current feeback in so far as gain is concerned but reducing the output impedance by a greater amount than it would be reduced by the same number of decibels of gain reduction with negative voltage feedback alone. By proper combination of resistances the impedance which the load looks back into can be made positive, negative, or zero, as desired.

By making the primary of the output transformer look back into a negative resistance which just cancels the primary resistance distortion in the transformer can be reduced. Harmonic distortion in this manner generated in the output transformer can be cancelled out by making the transformer primary look back into the negative of its own resistance. This negative resistance can be obtained by suitable choice of resistance values.

Since the phase shift of a two stage audio amplifier and output transformer approaches 180 degrees at high frequencies, a single negative voltage feedback loop from the secondary of the output transformer will tend to make the amplifier unstable at these frequencies. With a large amount of feedback the amplifier will oscillate at a high frequency and will go through a period of damped oscillations at a very low frequency if shock excited. If $V_1$ is a pentode with a screen by-pass capacitor the total phase shift can exceed 180 degrees at low frequencies and continuous low-frequency oscillations may occur with large feedback.

Figure 10:
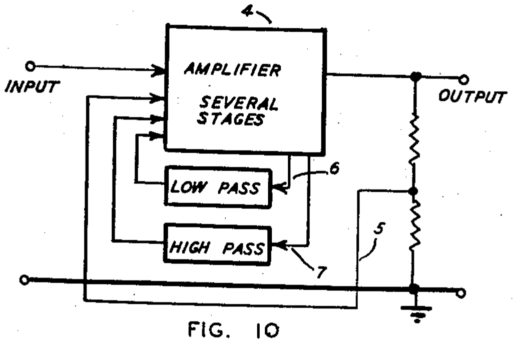
Figure 10 is a block diagram illustrating the principles of the circuit shown in Figure 9, and Figure 11 *a* and *b* shows a group of curves applying to the operation of the feedback loops of the amplifier.

Included in Figures 1 and 9 is a method and circuit which I have devised for stabilizing an amplifier at low and high frequencies. This is shown diagrammatically in Figure 10 by block diagram. The amplifier 4 of Figure 10 has a single negative feedback loop 5 tapping off a portion of the output voltage and feeding it back to an early part of the amplifier. At another point 6, in the amplifier where the signal voltage is considerably larger than the feedback voltage and where the maximum phase shift is considerably less than that of the entire amplifier, a voltage is tapped off and fed back through a low pass equalizer to an early part of the amplifier which may or may not be the same point at which the portion of the output voltage is fed back. This equalizer accomplishes two purposes. First it permits feedback at low frequencies only around a loop which has small enough total phase shift to maintain stability. This feedback voltage, being larger than the voltage from the output will become the main determining factor in the stability of the amplifier at low frequencies instead of the feedback voltage from the output. Secondly a low pass equalizer retards the phase of the signal passing through and partially compensates for the advance of phase within the amplifier at low frequencies. By proper choice of values the phase can be advanced enough in the critical frequency regions to maintain a high degree of stability.

At high frequencies a similar loop 7 through a high pass equalizer between the same or two other positions in the amplifier feeds back a voltage which at high frequencies is both advanced in phase in critical frequency regions to compensate for phase retardation of the amplifier and is larger than the feedback voltage from the output so that it becomes the main determining factor in the stability of the amplifier at high frequencies. The frequency characteristics of the high and low frequency equalizers can be chosen so that these two new feedback loops have negligible effect within the operating frequency range of the amplifier while at the same time they maintain a high degree of stability outside of this range. The use of these two additional loops makes a stable amplifier with a much greater amount of overall feedback at middle frequencies than would otherwise be possible for the same stability. It is possible to use a number of such high and low frequency loops intermingled around various sections of an amplifier so as to make it even more stable.

In the amplifier of Figure 9 a high frequency loop consisting of $C'_2$ between the plate of $V_2$ and the cathode of $V_1$ develops a feedback voltage mostly across $R'_2$ which is negligible at audio frequencies and which becomes at super-audible frequencies larger than the negative voltage feedback from the transformer secondary or the positive current feedback from the cathode of $V_2$. Since this feedback loop is around only two stages and since $C'_2$ advances the phase, a high degree of stability may be attained at high frequencies where the amplifier would otherwise oscillate.

Similarly at low frequencies a voltage from point C on the output transformer which is much larger than that at point B is fed back through $R'_1$ and $R'_2$ to the cathode of $V_1$. Since a potential at the junction of $C'_3$, $R'_4$, and $R'_5$ is relaitvely near ground, $C'_3$ functions as a by-pass capacitor permitting only low frequencies to pass through to the cathode of $V_1$. The feedback from this loop is negligible at audio frequencies, while due to the retardation of phase in the low pass equalizer formed by $R'_1$, $C'_3$, and $R'_5$ the amplifier is maintained more stable at sub-audible frequencies.

A further function of $C'_3$ is that it reduces the amount of positive current feedback from the cathode of $V_2$ at low frequencies and shifts the phase so as to maintain the amplifier stable.

$C'_3$ also reduces the amount of feedback from point B on the transformer at sub-audible frequencies, permitting the feedback from point C to take over.

Negative current feedback over the second stage alone is developed by the unby-passed cathode resistances $R'_4$ and $R'_5$. This reduces the gain distortion of $V_2$.

Since the cathode degeneration in the second stage makes it necessary for $V_1$ to supply extra voltage to drive $V_2$ to full output, $V_1$ will operate at a higher distortion level. By feeding back a voltage from point B at the output transformer through $R'_5$ and $R'_4$ to the cathode of $V_2$ the signal voltage between cathode and ground is reduced since this constitutes positive voltage feedback which partially compensates for the negative current feedback around $V_2$. Thus the gain of the second stage is maintained without the use of a cathode by-pass capacitor and $V_1$ can again operate at a lower distortion level.

Among the sources of transient distortion in an amplifier are the unused higher impedance windings of the output transformer. Due to poor coupling such windings sometimes exhibit transient oscillations when shock excited regardless of the load on the other windings which usually tends to damp out transient oscillations in the transformer. These oscillations can be damped out by shunting a resistance across the offending winding. In the circuit of Figure 9, $R'_1$ coupled through $C'_3$ in series with $R'_5$ together act as a damping resistance on the output winding between B and C and thus help maintain the high frequency stability of the amplifier.

$R'_2$ and $R'_1$ together provide cathode bias for $V_1$. If unby-passed a degenerative voltage will be developed across these resistors due to the plate current of $V_1$ and the gain of the stage will be reduced. In order to achieve maximum gain $R'_2$ and $R'_5$ are made much smaller than $R'_1$. Then $C'_3$ effectively acts as a cathode by-pass capacitor preventing degeneration across $R'_1$ and reducing the over-all cathode degeneration to negligibility.

$C'_3$ also acts as a blocking capacitor which makes it possible, if desired for controlling the output impedance manually, to combine $R'_4$ and $R'_5$ into a potentiometer whose arm can be moved without varying the bias on $V_1$.

Figure 1 has the elements designated as set forth in Figures 7, 8, and 9. The treble feedback control of Figure 7 and the bass feedback control of Figure 8 are tied into the first amplifier stage which includes the tube V, while the feedback loops between amplifier stages in Figure 1 are those which are more particularly shown in Figure 9, the output transformer being designated by T.

Figure 11:
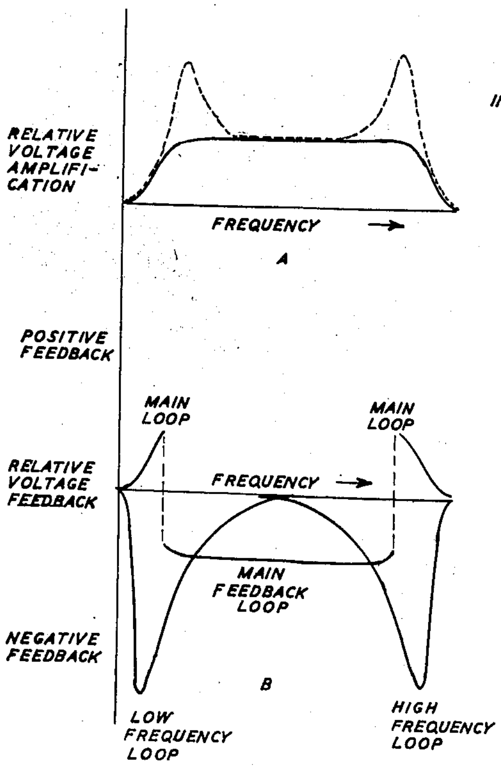

An illustration according to the present invention of the sort of amplification characteristics of a feedback amplifier employing a large amount of negative feedback is shown in Figure 11*a*. The dotted curve in the relative voltage amplification plotted on a logarithmic frequency scale before the application of the auxiliary high and low frequency feedback loops shows the peaks at high and low frequencies due to phase shift in the amplifier. Adding the high and low frequency loops flattens out the peaks and produces the solid curve. Figure 11*b* shows the relative amounts of voltage fed back through the main loop and the high and low frequency loops separately. The points where the phase of the main loop voltage passes through ninety degrees and so becomes positive feedback instead of negative feedback are indicated by a break in the curve and continuation of the curve in the positive region. At low and high frequencies the voltage fed back through the high and low frequency paths is large enough so that the main loop has negligible effect on the amplification. The phase shift in the low and high frequency loops is low enough so as to maintain the feedback negative over the whole range in which there is appreciable amplification.

Having now described my invention, I claim:

An audio frequency amplifier of the type described, having two stages of vacuum tube amplification with anode, cathode, and control electrodes, and an output transformer with a point on its secondary connected to ground, a first capacitance connected from the anode of the second stage to the cathode of the first stage, a pair of first and second series-connected resistances connected from the cathode of the first stage to a point on the transformer secondary remote from its grounded point, a pair of third and fourth resistances series-connected from the cathode of the second stage to a point on the transformer secondary near its grounded point, a second capacitance connected from between the first and second resistances to between the third and fourth resistances, said arrangement establishing the following feedback circuits: a main negative voltage feed back path connected from the secondary of the output transformer to the cathode of the first stage having in series the first and the fourth resistances with the second capacitance inbetween, a second positive voltage feedback path from the secondary of the output transformer to the cathode of the second stage including the third resistance and fourth resistance in series therewith, a third low frequency negative voltage feedback path from the secondary of the output transformer to the cathode of the first stage including a low pass filter comprising a series resistance and said capacitance acting as a shunt substantially to ground, and a fourth positive current feed back path from the cathode of the second stage to the cathode of the first stage including said capacitance in the circuit, and a fifth high frequency negative voltage feed back path comprising a capacitance connected from the anode of the second stage to the cathode of the first stage.

References Cited in the file of this patent

UNITED STATES PATENTS

| Number | Name | Date |
|---|---|---|
| 2,072,708 | Case | Mar. 2, 1937 |
| 2,186,571 | Beale | Jan. 9, 1940 |

| Number | Name | Date |
|---|---|---|
| 2,245,598 | Llewellyn | June 17, 1941 |
| 2,282,382 | Root | May 12, 1942 |
| 2,282,383 | Root | May 12, 1942 |
| 2,361,602 | Clark | Oct. 31, 1944 |
| 2,433,330 | Atkinson | Dec. 30, 1947 |
| 2,505,254 | Mesner | Apr. 25, 1950 |
| 2,529,459 | Pourciau et al. | Nov. 7, 1950 |
| 2,586,167 | Kamm | Feb. 19, 1952 |

FOREIGN PATENTS

| Number | Country | Date |
|---|---|---|
| 453,574 | Great Britain | Sept. 14, 1936 |

OTHER REFERENCES

"Radio Engineering," Terman, 3d ed., pp. 321–326 pub. 1947 by McGraw-Hill Book Co., N. Y. C. (Copy in Div. 69.)

Terman text of record, page 752.